United States Patent
Marshall et al.

(10) Patent No.: US 6,947,310 B1
(45) Date of Patent: Sep. 20, 2005

(54) FERROELECTRIC LATCH

(75) Inventors: Andrew Marshall, Dallas, TX (US);
Sumanth Katte Gururajarao, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/844,834

(22) Filed: May 13, 2004

(51) Int. Cl.⁷ .............................................. G11C 11/22
(52) U.S. Cl. ..................................... 365/145; 365/154
(58) Field of Search .......................... 365/145, 189.05, 365/154, 230.08

(56) References Cited

U.S. PATENT DOCUMENTS

| | | |
|---|---|---|
| 4,809,225 A | 2/1989 | Dimmler et al. |
| 4,853,893 A | 8/1989 | Eaton, Jr. et al. |
| 4,910,708 A | 3/1990 | Eaton, Jr. et al. |
| 4,914,627 A | 4/1990 | Eaton, Jr. et al. |
| 4,918,654 A | 4/1990 | Eaton, Jr. et al. |
| 5,680,344 A | 10/1997 | Seyyedy |
| 6,069,816 A | 5/2000 | Nishimura |
| 6,141,237 A | 10/2000 | Eliason et al. |
| 6,141,242 A | 10/2000 | Hsu et al. |
| 6,259,126 B1 | 7/2001 | Hsu et al. |
| 6,263,398 B1 | 7/2001 | Taylor et al. |
| 6,285,575 B1 | 9/2001 | Miwa |
| 6,362,675 B1 * | 3/2002 | Alwais ........................ 365/145 |
| 6,590,798 B1 * | 7/2003 | Komatsuzaki .............. 365/145 |
| 6,707,702 B1 | 3/2004 | Komatsuzaki |

* cited by examiner

*Primary Examiner*—Thong Q. Le
(74) *Attorney, Agent, or Firm*—Jacqueline J. Garner; W. James Brady, III; Frederick J. Telecky, Jr.

(57) ABSTRACT

Ferroelectric latch type memory devices (102) are provided, comprising an input circuit (110) with first and second internal nodes (N1, N2) coupled with first and second ferroelectric capacitors ($C_{FE}1$, $C_{FE}2$), a control circuit (120), a restore circuit (130), and an output circuit (140). The input circuit (110) operates in a first mode to provide the input data state as first and second voltages on the first and second internal nodes (N1, N2), respectively. In a second mode, the input circuit (110) allows the internal nodes (N1, N2) to float, the restore circuit (130) operates to restore the data state from the ferroelectric capacitors ($C_{FE}1$, $C_{FE}2$) to the internal nodes (N1, N2), and the output circuit (140) provides a restored data state as an output (OUT).

22 Claims, 9 Drawing Sheets

FERROELECTRIC LATCH

FIELD OF INVENTION

The present invention relates generally to semiconductor devices and more particularly to an improved ferroelectric latch.

BACKGROUND OF THE INVENTION

In semiconductor memory devices, data is read from or written to the memory using address signals and various other control signals. In random access memories ("RAMs"), an individual binary data state (e.g., a bit) is stored in a volatile memory cell, wherein a number of such cells are grouped together into arrays of columns and rows accessible in random fashion along bitlines and wordlines, respectively, wherein each cell is associated with a unique wordline and bitline pair. Address decoder control circuits identify one or more cells to be accessed in a particular memory operation for reading or writing, wherein the memory cells are typically accessed in groups of bytes or words (e.g., generally a multiple of 8 cells arranged along a common wordline). Thus, by specifying an address, a RAM is able to access a single byte or word in an array of many cells, so as to read or write data from or into that addressed memory cell group.

Two major classes of random access memories include "dynamic" (e.g., DRAMs) and "static" (e.g., SRAMs) devices, both of which do not maintain the stored data when power is removed. For a DRAM device, data is stored in a capacitor, where an access transistor gated by a wordline selectively couples the capacitor to a bit line. DRAMs are relatively simple, and typically occupy less area than SRAMs. However, DRAMs require periodic refreshing of the stored data, because the charge stored in the cell capacitors tends to dissipate. Accordingly DRAMs need to be refreshed periodically in order to preserve the content of the memory. SRAM devices, on the other hand, do not need to be refreshed. SRAM cells typically include several transistors configured as a latch or flip-flop having two stable states, representative of two binary data states. Since the SRAM cells include several transistors, however, SRAM cells occupy more area than do DRAM cells. However, SRAM cells operate relatively quickly and do not require refreshing and the associated logic circuitry for refresh operations.

A major disadvantage of SRAM and DRAM devices is volatility, wherein removing power from such devices causes the data stored therein to be lost. For instance, the charge stored in DRAM cell capacitors dissipates after power has been removed, and the voltage used to preserve the latch data states in SRAM cells drops to zero, by which the latch loses its data. Accordingly, SRAMs and DRAMs are commonly referred to as "volatile" memory devices. Non-volatile memories are available, such as Flash and EEPROM. However, these types of non-volatile memory have operational limitations on the number of write cycles.

Another form of non-volatile memory is ferroelectric RAM devices, sometimes referred to as FERAMs or FRAMs. FERAM cells employ ferroelectric cell capacitors including a ferroelectric material between a pair of capacitor plates. Ferroelectric materials have two different stable polarization states that may be used to store binary information, where the ferroelectric behavior follows a hysteresis curve of polarization versus applied voltage. FERAMs are non-volatile memory devices, because the polarization state of a ferroelectric cell capacitor remains when power is removed from the device. Ferroelectric memories provide certain performance advantages over other forms of non-volatile data storage devices, such as Flash and EEPROM type memories. For example, ferroelectric memories offer short programming (e.g., write access) times and low power consumption. However, access times in SRAM and DRAM type memories are significantly shorter than in FERAM devices.

Hybrid memory devices have been developed, which include volatile and non-volatile portions. For example, memory cells have been constructed combining an SRAM cell or latch with ferroelectric capacitors for non-volatile data storage, which are sometimes referred to as ferroelectric latches or FE latches. An FE latch may be operated as an SRAM, with the capability to backup or save the volatile SRAM data to ferroelectric capacitors. In one mode of operation, the latched data is stored to the ferroelectric capacitors each time the data is written. Alternatively, the cell may be operated as an SRAM cell, with the data being stored to the ferroelectric capacitors only in certain conditions, for example, prior to removing power from the device. Upon powerup, the non-volatile data may be retrieved or restored from the ferroelectric capacitors and transferred to the SRAM cell latch.

FIG. 1 illustrates a conventional FE latch 2 consisting of a CMOS SRAM latch or cell 4 with two internal nodes NODE1 and NODE2, and a non-volatile (e.g., shadow) portion consisting of two ferroelectric capacitors C1 and C2 coupled with NODE1 and NODE2, respectively. The SRAM cell 4 includes two PMOS transistors T1 and T3 and two NMOS transistors T2 and T4 forming a pair of cross-coupled CMOS inverters. The internal nodes NODE1 and NODE2 are cross-coupled to the inverters, with NODE1 being coupled with the gates of transistors T3 and T4, and NODE2 being coupled with the gates of transistors T1 and T2. In addition, transistors T5 and T6 are provided to selectively couple NODE1 and NODE2 to complementary bitlines BL and BLB, respectively, wherein the gates of the access transistors T5 and T6 are coupled to a wordline WL. The nodes NODE1 and NODE2 are further coupled with the upper terminals of the ferroelectric capacitors C1 and C2, respectively, for non-volatile data storage therein, wherein the lower ferroelectric capacitor terminals are coupled to a plateline signal PL.

In operation, the plateline signal PL is generally held low (e.g., at ground or Vss), whereby the volatile SRAM latch 4 operates as a normal SRAM cell, with data being accessed along the bitlines BL and BLB for read or write operations via the transistors T5 and T6, respectively, according to the wordline signal WL. To store the SRAM data to the ferroelectric capacitors C1 and C2, a plateline pulse signal is applied by decoder control circuitry (not shown), by which the capacitors C1 and C2 are polarized to opposite states. In one example, where the SRAM data is such that NODE1 is low (Vss) and NODE2 is high (Vdd), the ferroelectric capacitor C2 is polarized in a first direction or polarization state since the plateline signal PL is initially low. The plateline signal PL is then pulsed high to polarize the other ferroelectric capacitor C1 to a second opposite polarization state or direction, after which the plateline goes low again. In this manner, the high node NODE2 of the SRAM cell 4 corresponds to C2 being programmed to the "high" polarization state, and the low level at NODE1 has been written as a "low" polarization state to C1. Similar operation is found where the data in the SRAM is of an opposite binary value, such as where NODE2 is at a low voltage level (Vss) and NODE1 is at a high voltage level (Vdd).

If power is thereafter removed, and is then re-established, the differences in capacitance at the internal nodes due to the opposite polarization states of C1 and C2 allow the SRAM latch 4 to be restored to its previous data state when the supply voltage Vdd returns to the normal operational level. To read the non-volatile data into the SRAM 4 upon return of the supply voltage Vdd, the plateline PL is held low with the wordline WL deactivated (e.g., low). In one mode of operation, the capacitance difference between the oppositely polarized ferroelectric capacitors C1 and C2 causes T2 and T3 to turn on before T1 and T4 can turn on, whereby NODE1 is pulled low by T2 and NODE2 is pulled high by T3, thereby restoring the data state to the SRAM latch 4. In another possible restore operation, the plateline signal PL is brought high and then low (e.g., pulsed) to provide voltages across the ferroelectric capacitors C1 and C2 such that the ferroelectric capacitor having a "high" polarization state will experience a polarization reversal, with the resulting transferred charge causing the corresponding internal node to rise faster than the other internal node, whereby the non-volatile data state is latched in the SRAM latch 4.

The reliability of the restore operation in the FE latch 2 is only ensured if the threshold voltage Vt of the two inverters (T1, T2 and T3, T4) are well matched. If they are not, the latch 4 can return into an incorrect data state. Accordingly, there is a need for improved FE latch memory devices combining SRAM or other volatile memory cells with non-volatile ferroelectric capacitors for storing data in a semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to FE latch memory devices in which internal nodes coupled with ferroelectric capacitors are driven to voltages representing an input data state and the capacitors are then polarized according to the input data state. In retrieving the non-volatile data from the ferroelectric capacitors, the internal nodes are floated and then coupled to a supply voltage to charge the ferroelectric capacitors, with the restored data state being determined according to the which internal node voltage rises fastest. In this manner, the invention avoids the situation in conventional FE latches where the restored data state was susceptible to threshold voltage variations in the latch transistors.

In one aspect of the invention, a memory device is provided, that comprises an input circuit with first and second internal nodes coupled with first and second ferroelectric capacitors, a control circuit, a restore circuit, and an output circuit. The input circuit provides a selectable data latch that can selectively store data from an input, which is then transferred to the ferroelectric capacitors for non-volatile (e.g., recoverable) storage. The input circuit operates in a first mode to provide the input data state as first and second voltages on the first and second internal nodes, respectively. The control circuit operates to selectively provide a plateline signal (e.g., a plateline pulse to the lower terminals of the ferroelectric capacitors) to store the data state as opposite polarization states on the ferroelectric capacitors according to the first and second voltages when the input circuit is in the first mode. In a second mode, the input circuit allows the internal nodes to float for restoration of the data state from the ferroelectric capacitors. The restore circuit operates in the second mode to restore the data state from the ferroelectric capacitors to the first and second internal nodes, and the output circuit provides a restored data state as an output in the second mode.

Another aspect of the invention relates to a method for providing non-volatile data storage in a memory device. The method comprises providing an input voltage signal representative of a data state, providing first and second voltages at first and second circuit nodes, respectively, according to the input voltage signal, polarizing first and second ferroelectric capacitors according to the first and second voltages, respectively, allowing the first and second circuit nodes to float after polarizing the first and second ferroelectric capacitors, coupling the first and second circuit nodes with a first supply voltage, and latching a data state from the first and second circuit nodes while the first and second circuit nodes are coupled with the first supply voltage.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
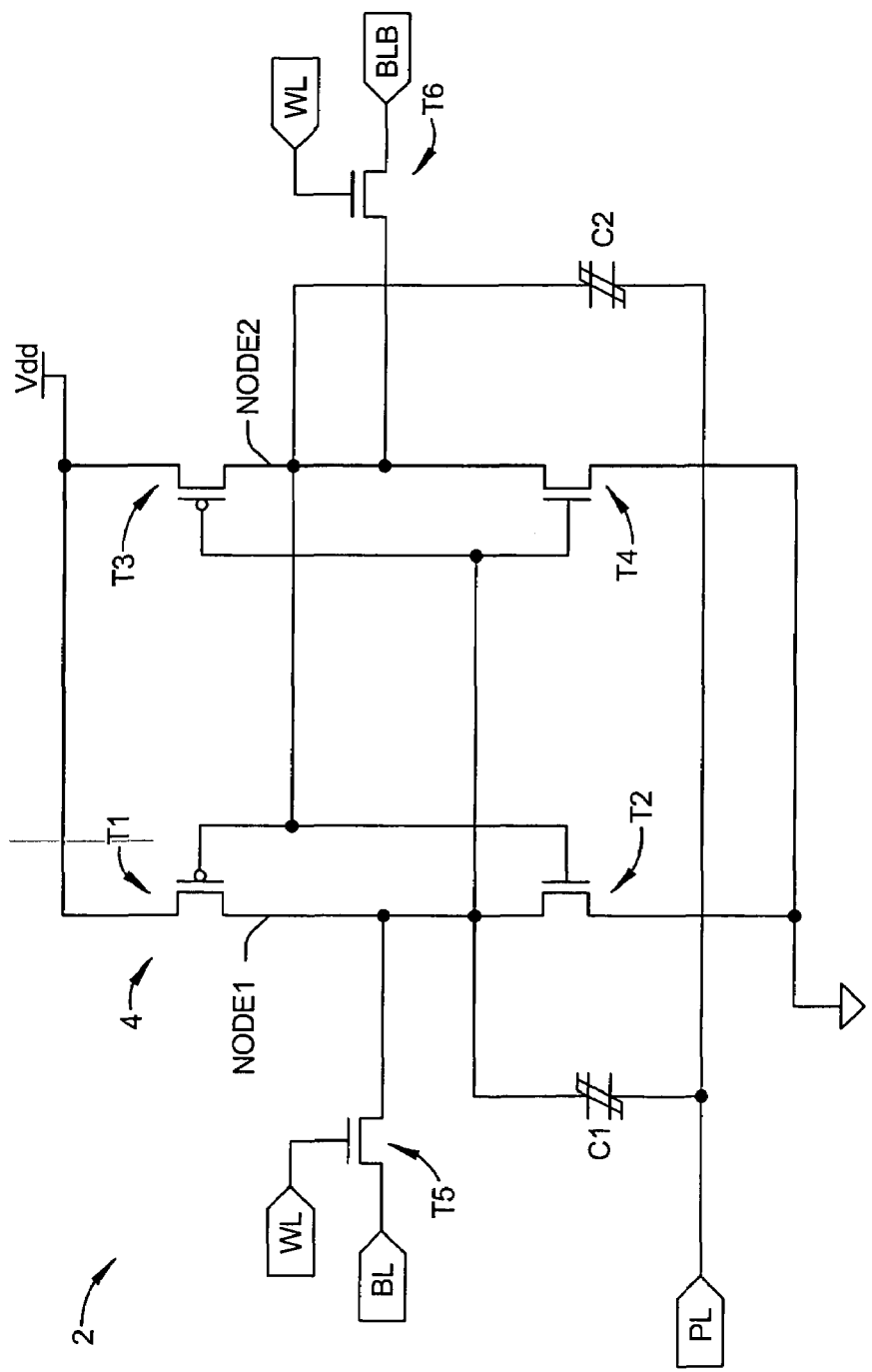
FIG. 1 is a schematic diagram illustrating a conventional ferroelectric latch.

One or more implementations of the present invention will now be described with reference to the attached drawings, wherein like reference numerals are used to refer to like elements throughout, and wherein the timing diagrams and waveforms thereof are not necessarily drawn to scale.

Figure 2A:
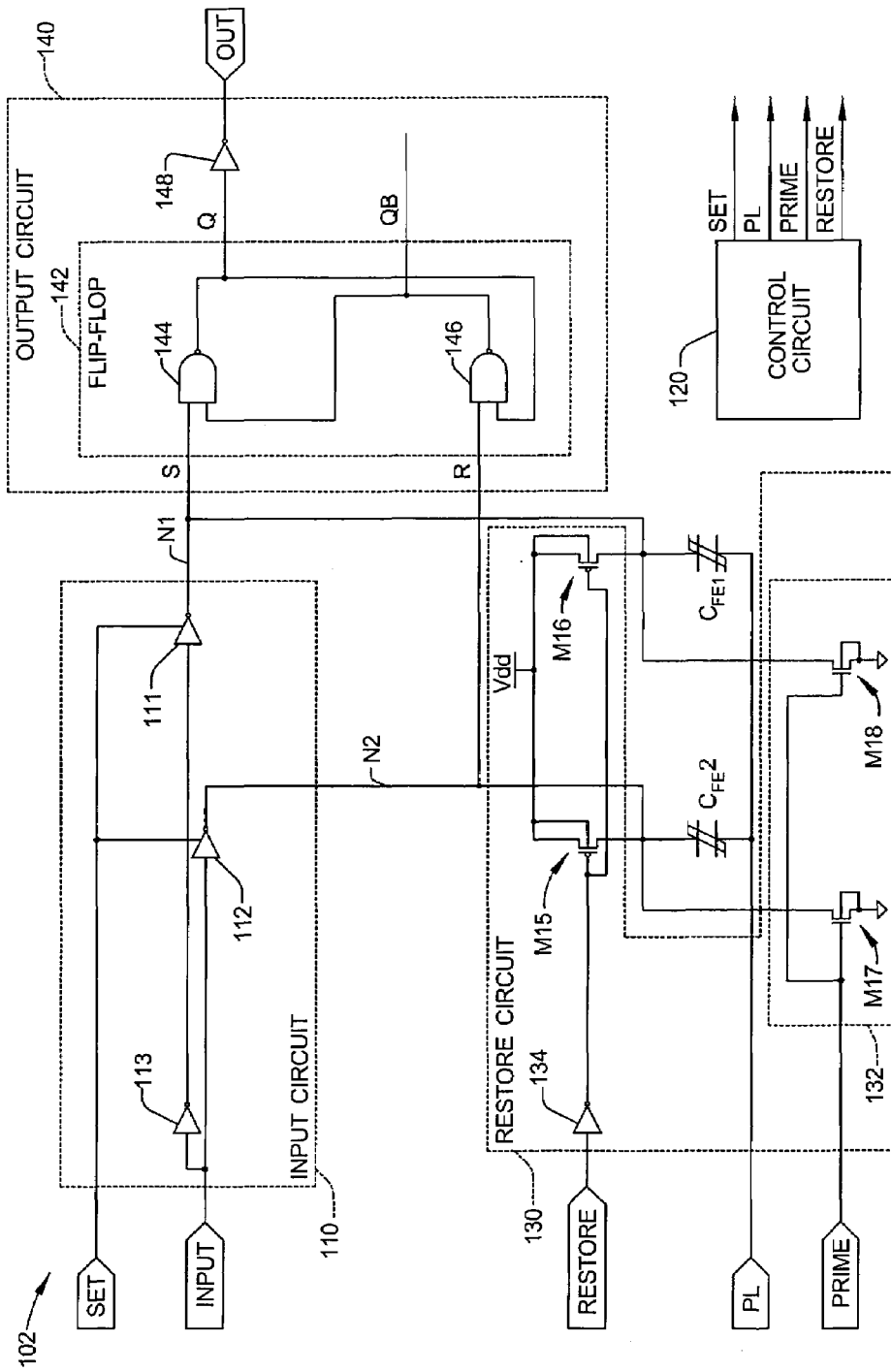
FIGS. 2A and 2B are schematic diagrams illustrating an exemplary ferroelectric latch in accordance with one or more aspects of the present invention.
Figure 2B:
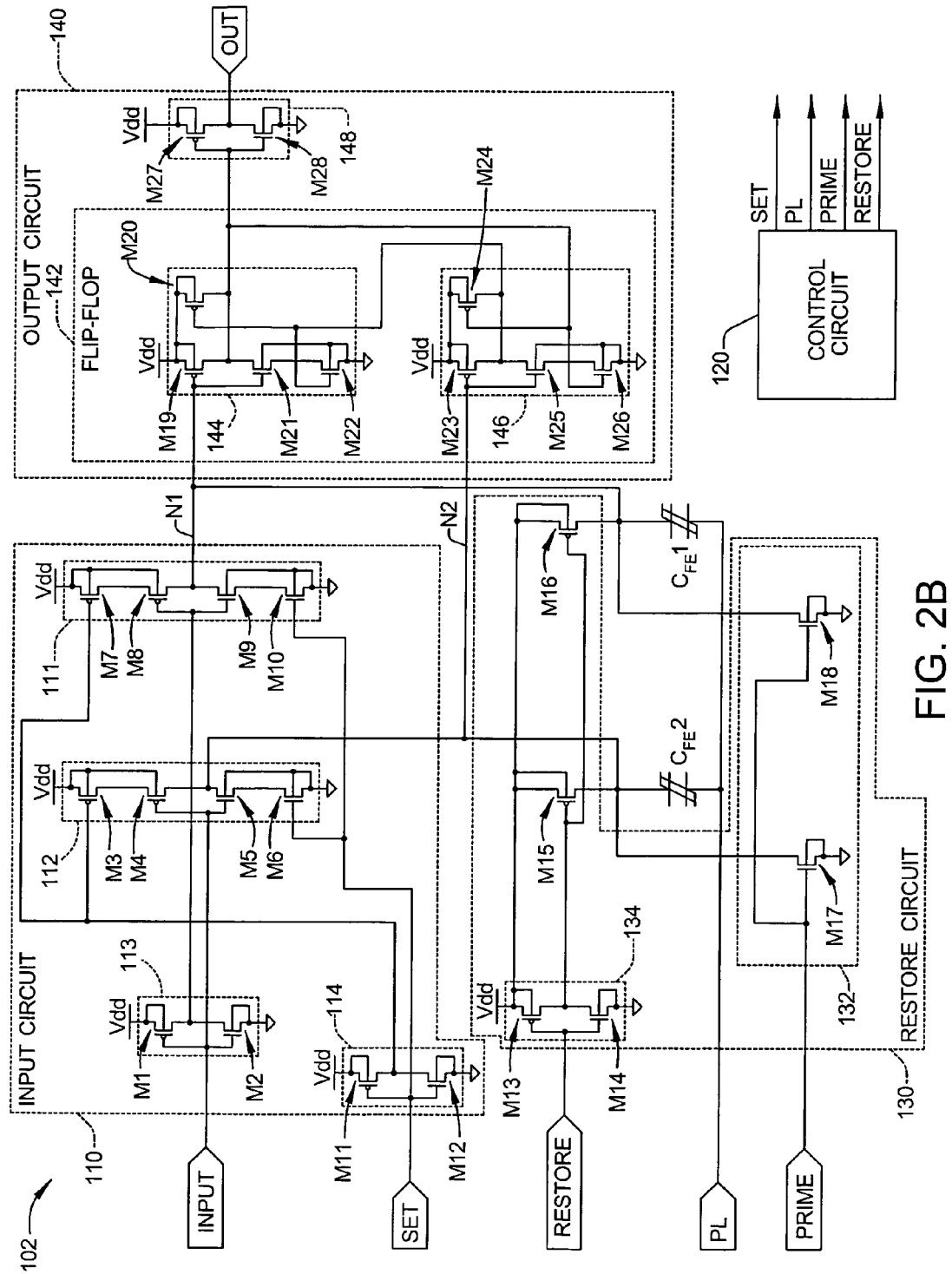
Figure 2C:
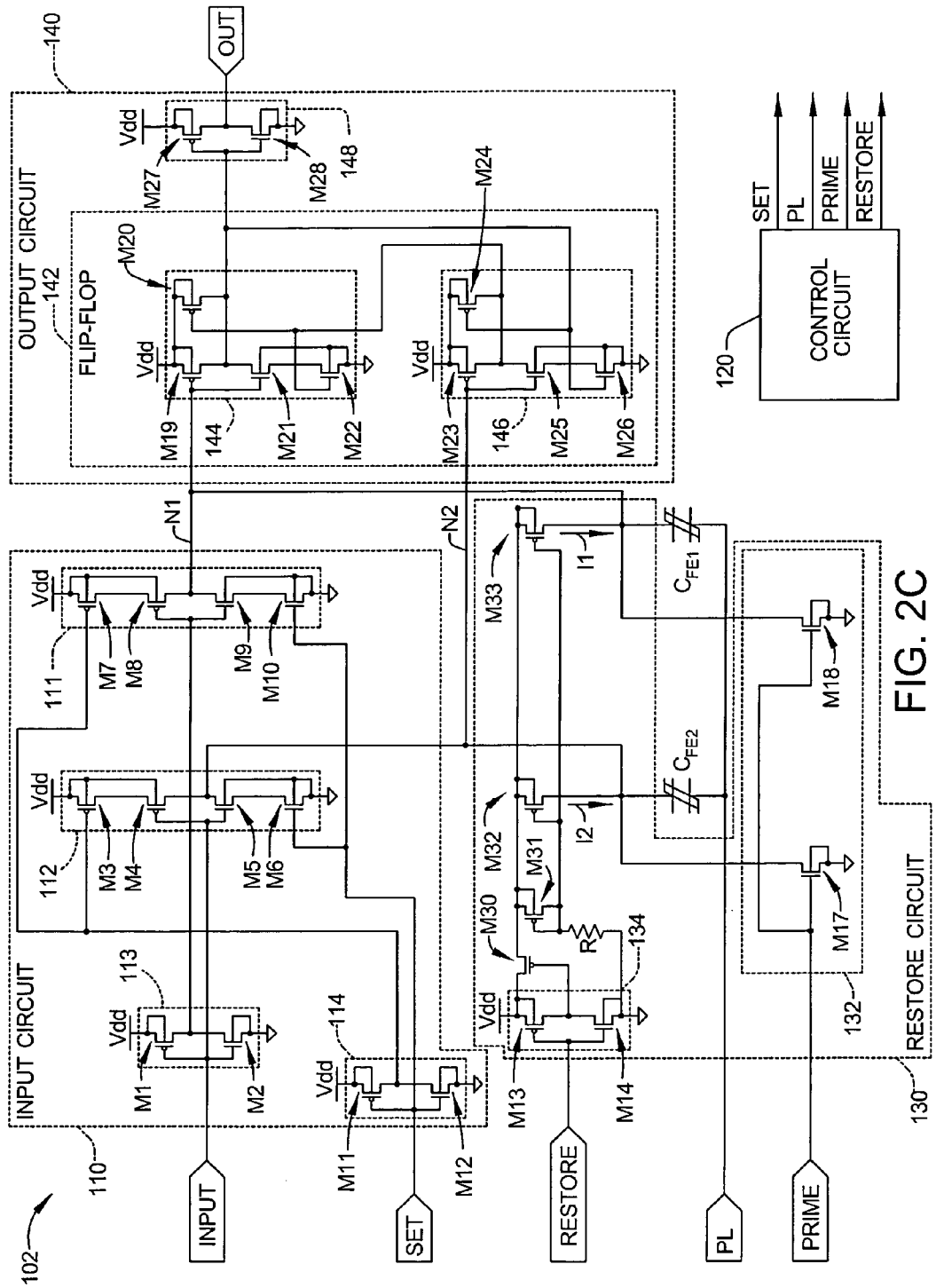
FIG. 2C is a schematic diagram illustrating an alternative implementation of the ferroelectric latch of FIGS. 2A and 2B, in which the restore circuit comprises a current mirror.

FIGS. 2A and 2B illustrate an exemplary ferroelectric latch memory device 102 with a restore circuit 130 comprising first and second charging transistors M15 and M16 in accordance with one or more aspects of the present invention, and FIG. 2C illustrates an alternative implementation of the device of FIGS. 2A and 2B, in which the restore circuit comprises a current mirror circuit. As illustrated in FIG. 2A, the device 102 comprises an input circuit 110, a control circuit 120, a restore circuit 130, and an output circuit 140. Two ferroelectric capacitors $C_{FE}1$ and $C_{FE}2$ are coupled between a plateline node PL and internal nodes N1 and N2, respectively, for non-volatile data storage, where the data can be retrieved or restored from the capacitors $C_{FE}1$ and $C_{FE}2$ via the restore circuit 130 and the output circuit 140, and wherein the control circuit 120 provides various control signals SET, PL, PRIME, and RESTORE, in first and second operational modes as described further hereinafter.

The input circuit 110 comprises an input node INPUT receiving an input voltage representative of a binary data state, which is high (e.g., Vdd) or low (e.g., Vss or ground) in the illustrated example. Like the other digital voltage levels of the illustrated device 102, any two-state voltage levels or dual mutually exclusive voltage ranges may be employed for binary signal voltages in the memory devices of the invention, wherein all such variant implementations are contemplated as falling within the scope of the invention and the appended claims.

The input circuit 110 also comprises a pair of tri-state inverters 111 and 112 with enable or set control inputs, and a third inverter 113. The device input node INPUT is coupled to the inverter inputs of the second and third inverters 112 and 113, and the output of the third inverter 113 is coupled to the input of the first inverter 111. The first inverter 111 has an output coupled with the first internal node N1, and the output of the second inverter 112 is coupled with the second internal node N2. In one possible alternative implementation, the input may be received on a pair of complementary bitlines (e.g., like BL and BLB in FIG. 1 above), with access transistors coupling BL to the second inverter input and BLB to the first inverter input according to a wordline signal (not shown), in which case the third inverter 113 may be omitted.

In a first operational mode, the tri-state inverters 111 and 112 are enabled via a SET enable signal from the control system 120, and operate essentially as a latch or SRAM cell, where the SET signal is high in the first mode, and low in a second mode discussed below. In the first mode, the input circuit 110 provides the data state of the input as first and second voltages on the nodes N1 and N2, respectively. For example, if INPUT is high, node N1 is high and N2 is low in the first mode, and vice versa if INPUT is low. Conversely, in the second mode, the tri-state inverters 111 and 112 allow the internal nodes N1 and N2 to float.

The control circuit 120 provides a plateline signal PL to store the input data state as opposite polarization directions or states to the ferroelectric capacitors $C_{FE}1$ and $C_{FE}2$ according to the voltages latched at the nodes N1 and N2 in the first mode, wherein the control circuit 120 can be any suitable circuitry or system to generate the various control signals as illustrated and described herein. The plateline node is initially held low by the control circuit 120 (e.g., ground) in the first operational mode as an input voltage is received at the input node INPUT. As such, the ferroelectric capacitor associated with the high internal node will be polarized in a first direction or data state. In the above example with a high input voltage, N1 is high and N2 is low in the first mode, and consequently, $C_{FE}1$ is polarized in a first direction while the plateline PL is low.

Thereafter, the plateline signal is brought high by the control circuit 120, thereby polarizing the other ferroelectric capacitor $C_{FE}2$ in a second opposite direction, after which the plateline signal PL returns low. Thus, the polarization states of the ferroelectric capacitors $C_{FE}1$ and $C_{FE}2$ in indicative of the input data state. In the other possible case where the input is low, N1 will be low, N2 will be high, and the capacitor $C_{FE}2$ is polarized in the first direction when PL is low, and then $C_{FE}2$ is polarized in the second opposite direction when PL goes high.

Once the data (e.g., non-volatile data state) has been stored by polarizing the capacitors $C_{FE}1$ and $C_{FE}2$, the control circuit 120 switches the input circuit 110 to a second operational mode by discontinuing the SET signal (e.g., SET goes low), thus placing the first and second inverter outputs of inverters 111 and 112 in a high impedance state, whereby the internal nodes N1 and N2 are allowed to float. Alternatively, the input circuit 110 may be continuously operated as a latch or SRAM cell with the SET signal high until power is removed or until the stored non-volatile state needs to be retrieved. In either case, once the data has been stored into the ferroelectric capacitors $C_{FE}1$ and $C_{FE}2$, power can be removed from the device (e.g., Vdd goes to ground), and the non-volatile data state is preserved in the ferroelectric capacitors $C_{FE}1$ and $C_{FE}2$.

The non-volatile data state can be restored or retrieved from the capacitors $C_{FE}1$ and $C_{FE}2$ in the second mode, wherein the SET signal is low and the plateline PL is low. The restore circuit 130 operates to restore the data state from the first and second ferroelectric capacitors $C_{FE}1$ and $C_{FE}2$ to the first and second internal nodes N1 and N2 in the form of rising node voltages as illustrated and described further below with respect to FIG. 6, and the output circuit 140 provides a restored data state at an output node OUT according to the data state from the capacitors $C_{FE}1$ and $C_{FE}2$ when the input circuit is in the second mode. Although the exemplary device 102 is illustrated as having a single output node OUT, alternative implementations are possible in which two complementary outputs are provided by the output circuit 140 having opposite data states (e.g., one high and one low), wherein all such variant implementations are contemplated as falling within the scope of the invention.

The exemplary restore circuit 130 comprises a pair of discharge transistors M17 and M18 for initially grounding the previously floating internal nodes N1 and N2, as well as a pair of charging transistors M15 and M16 for selectively coupling the nodes N1 and N2 to the supply voltage Vdd, although other implementations are possible wherein the discharging transistors M17 and M18 and the PRIME control signal are omitted. Furthermore, FIG. 2C illustrates an alternative implementation in which the restore circuit 130 includes a current mirror, as described in greater detail below. In the implementation of FIGS. 2A and 2B, a control signal RESTORE is provided to the restore circuit 130 by the control circuit 120 and is passed through an inverter 134. This inverter 134 provides an output to the gates of the transistors M15 and M16, whereby the charging transistors M15 and M16 turn on to couple the nodes N1 and N2 to Vdd when the RESTORE signal is high. In addition, a PRIME control signal is provided to the gates of M17 and M18 by the control circuit 120.

A first discharge transistor M18 is coupled between ground or Vss or other second supply voltage and the first internal node N1, and a second discharge transistor M17 is coupled between ground and the second internal node N2, wherein the transistors M17 and M18 are operable in the second mode to ground N2 and N1, respectively according to a PRIME signal (e.g., PRIME high) from the control system 120. To read the non-volatile data in the exemplary device 102, the control circuit 120 initially pulses PRIME high to ensure that the previously floating internal nodes N1 and N2 are returned to ground prior to charging the capacitors $C_{FE}1$ and $C_{FE}2$.

The control circuit 120 then returns PRIME to ground and raises RESTORE to Vdd, where RESTORE may go high before or after PRIME is lowered, or the PRIME and RESTORE signals may be switched concurrently, wherein all such variant implementations are contemplated as falling within the scope of the present invention. For extracting the non-volatile data state from the capacitors $C_{FE}1$ and $C_{FE}2$, a first charging transistor M16 is coupled between Vdd and N1, and a second charging transistor M15 is coupled between Vdd and N2. When the control circuit 120 brings the RESTORE control signal high (e.g., thus turning transistors M15 and M16 on while the SET input is low in the second mode), the internal nodes N1 and N2 are brought up to the supply voltage Vdd, thereby charging the ferroelectric capacitors $C_{FE}1$ and $C_{FE}2$.

The output circuit 140 comprises a flip-flop circuit 142 and an optional output inverter 148, where the flip-flop 142 comprises first and second cross-coupled or latch-connected NAND gates 144 and 146, respectively, with a first flip-flop input S is coupled with N1 and a second flip-flop input R is coupled with N2. In a read operation to retrieve the non-volatile data state from the ferroelectric capacitors $C_{FE}1$ and $C_{FE}2$, the flip-flop 142 of the output circuit 140 is set or reset (e.g., a flip-flop output Q goes low or high) according to which of the internal node voltages N1 or N2 rises fastest. In the illustrated example, the output Q goes low (e.g., the final inverted output OUT from inverter 148 goes high) where N1 rises faster than N2. Thus, the final output OUT (high) corresponds to the originally stored input data state (high). Conversely, if the opposite data state was stored in the capacitors $C_{FE}1$ and $C_{FE}2$, N2 will rise faster than N1, whereby the flip-flop output is set low, and the final output OUT is set high. In one possible alternative implementation, the final output OUT may be directly driven by the complementary flip-flop output QB (FIG. 2A), in which case, the inverter 148 may be omitted.

The various transistors of the device 102 may be of similar channel width and length dimensions to facilitate fabrication processing. In one preferred implementation, the charging transistors M15 and M16 are matched with one another and have longer channel lengths to provide drive currents to charge the ferroelectric capacitors $C_{FE}1$ and $C_{FE}2$ relatively slowly, thereby facilitating detection by the output circuit 140 of which internal node rises faster. Compared with the conventional FE latch 2 of FIG. 1, it is noted that recovery or restoration of the correct non-volatile data state is no longer inhibited by threshold voltages of the input latch inverters 111 and 112. Rather, the charging transistors M15 and M16 are both activated by the same signal from the inverter 134, and the propriety of the restored data state is only limited by the matching of the charging currents through M15 and M16 (e.g., or by the matching of currents 11 and 12 in the current mirror implementation of FIG. 2C below).

FIG. 2B illustrates one particular detailed CMOS implementation of the device 102 of FIG. 2A. As illustrated in FIG. 2B, the tri-state inverters 111 and 112 of the input circuit 110 may be constructed from two NMOS and two PMOS transistors, and each of the inverter circuits 113, 114, 134, and 148 may be implemented as a CMOS inverter with a single PMOS and a single NMOS transistor. Further, the flip-flop NAND gates 144 and 146 are individually formed of two NMOS and two PMOS transistors. Other circuit implementations are of course possible within the scope of the invention and the appended claims for the input circuit 110, the restore circuit 130, and/or the output circuit 140, wherein the illustrated device 102 of FIG. 2A is but one example. Furthermore, the control circuit 120 may be constructed of any suitable circuit elements or components to implement the functionality illustrated and described herein.

In the input circuit 110, the first tri-state inverter 111 comprises a CMOS inverter formed by a PMOS transistor M8 and an NMOS transistor M9, as well as transistors M7 and M10 for selectively coupling the inverter M8, M9 to the first and second supply voltages (e.g., Vdd and ground or Vss in this example) according to the SET enable control signal from the control circuit 120. Thus, when SET is high, the inverter 114 provides a low output signal to the gate of M7, whereby M7 couples the inverter PMOS transistor M8 to Vdd and M10 couples the inverter NMOS transistor to ground or Vss. With the tri-state inverter 111 thus enabled, the output internal node N1 is driven high or low by the inverter 111 according to the device input. The second tri-state inverter 112 is constructed in similar fashion using transistors M3–M6, wherein a high SET signal enables the inverter 112 to drive the second internal node N2 low or high according to the device input. The other inverters 113 and 114 of the input circuit 110 are comprised of transistors M1, M2 (inverter 113) and M11, M12 (inverter 114).

In the output circuit 140 of FIG. 2B, the final output OUT is driven by a CMOS inverter 148 formed of transistors M27 and M28, which receive an input from the flip-flop 142. The flip-flop 142 is an R-S flip-flop comprising first and second NAND gate circuits 144 and 146 receiving S and R inputs from the first and second internal nodes N1 and N2, respectively. The first NAND gate 144 comprises transistors M19–M22, with a first input (e.g., from N1) coupled to the gates of the PMOS transistor M19 and the NMOS transistor M21. The NAND gate output is coupled to source/drains of transistors M19–M21, and a second NMOS transistor M22 is coupled between ground and M21, with a gate of M22 being coupled to the gate of the PMOS transistor M20, as well as to the output of the second NAND gate circuit 146. The second NAND gate 146 is similarly constructed of transistors M23–M26, with inputs coupled to the second internal node N2 and the output of the first NAND gate 144, and with the second NAND gate output being coupled as an input to the first NAND gate 144.

An alternate implementation of the memory device 102 is illustrated in FIG. 2C, wherein the input circuit 110, the output circuit 140, and the control circuit 120 are the same as described above in FIGS. 2A and 2B. In the implementation of FIG. 2C, however, a restore circuit 130a comprises a current mirror operable in the second mode to provide first and second generally equal currents 11 and 12 to the nodes N1 and N2 for charging the ferroelectric capacitors $C_{FE}1$ and $C_{FE}2$ according to the RESTORE control signal. The current mirror is a PMOS current mirror comprising PMOS transistors M30–M33 and a resistor R. When the control signal RESTORE is brought high by the control circuit 120, the inverter 134 provides a low signal to the gate of M30, whereby the upper source/drains of M31–M33 are coupled with the supply voltage Vdd. M31 has a lower source/drain and a gate coupled with a first terminal of the resistor R, where the other resistor terminal is grounded to Vss. The resistor establishes a current through M31, which is then mirrored to M32 and M33 according to the relative sizes of M31–M33, wherein the transistors M32 and M33 are preferably the same size to provide generally equal charging currents 11 and 12 to the nodes N1 and N2, respectively, in the second mode.

Figure 3:
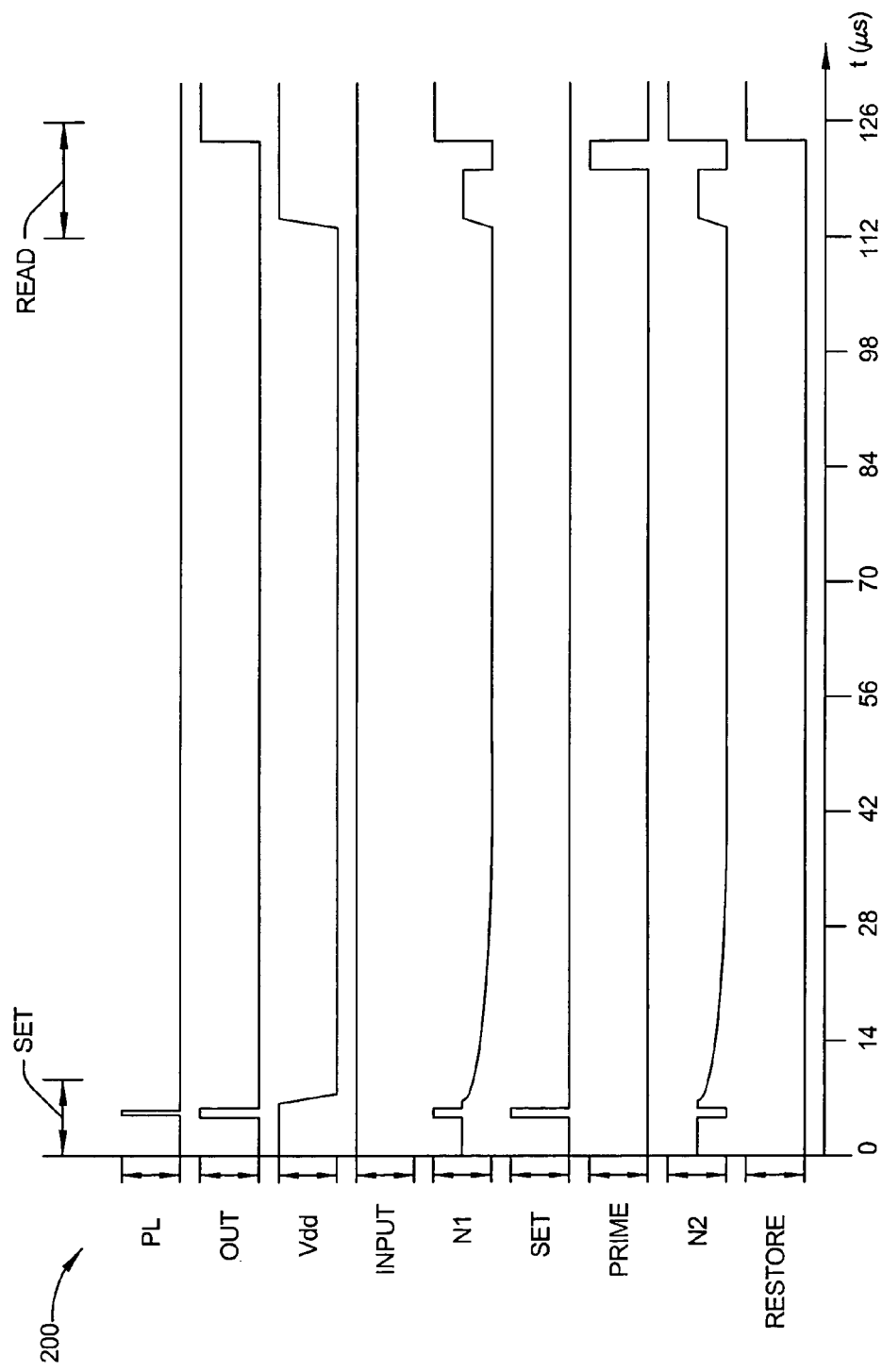
FIG. 3 is a waveform diagram illustrating set and read operations in the ferroelectric latch of FIGS. 2A and 2B.

Referring also to FIGS. 3–6, timing waveform diagrams 200, 300, and 400, respectively, illustrate various control signals and circuit node voltages to further illustrate operation of the exemplary FE latch memory device 102 of FIGS. 2A–2C, and FIG. 6 illustrates a plot of the internal nodes N1 and N2 rising during restore read operation in the device 102 for the case when the stored non-volatile data represents an input high state. FIG. 3 provides a waveform diagram 200 illustrating set and read (e.g., restore) operations in the device 102 with power being removed between the set and read operations, wherein the control circuit provides a high SET input signal to place the input circuit 110 in the first operational mode during at least a portion of the set operation, and lowers the SET input during the read operation.

Figure 4:
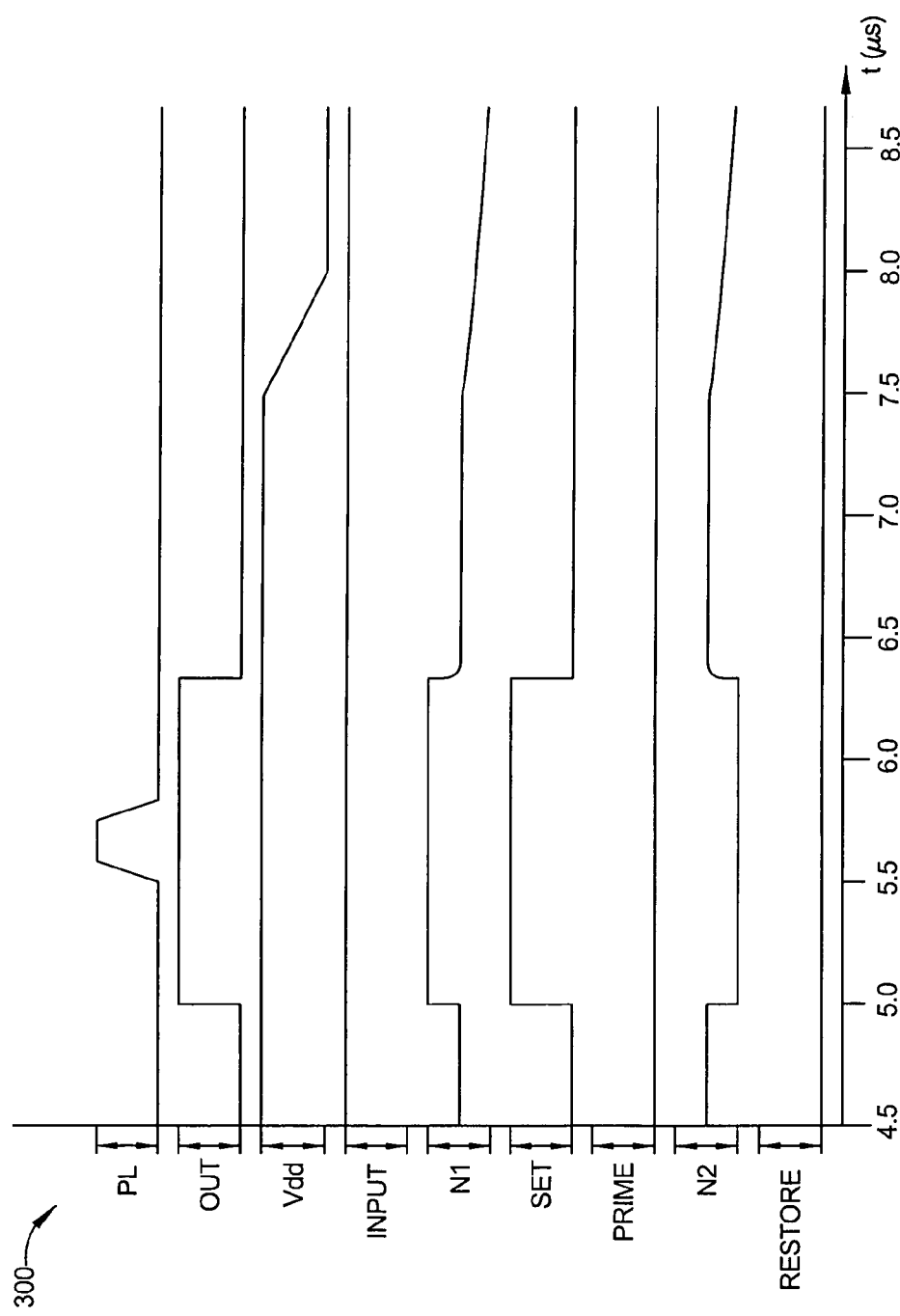
FIG. 4 is a waveform diagram further illustrating a set operation in the ferroelectric latch of FIGS. 2A and 2B.

FIG. 4 presents a waveform diagram 300 illustrating further detail of the set operation of FIG. 3, wherein the device input is high and the internal nodes N1 and N2 are initially shown floating with the SET, PRIME, RESTORE, and PL control signals low. SET is then asserted (e.g., raised to Vdd), thereby enabling the tri-state inverters 111 and 112 of the input circuit 110, which accordingly drive the internal nodes N1 and N2 high and low, respectively. With the SET signal high, the plateline is pulsed high then low, after which both the ferroelectric capacitors $C_{FE}1$ and $C_{FE}2$ are polarized according to the node voltages N1 and N2 driven by the input circuit inverters 111 and 112. With the non-volatile data thus stored in the capacitors $C_{FE}1$ and $C_{FE}2$, the control circuit 122 then lowers the SET signal, by which the internal nodes N1 and N2 are again allowed to float, and power is then removed from the device 102 (e.g. the supply voltage Vdd falls to ground), as shown in FIGS. 3 and 4.

Figure 5:
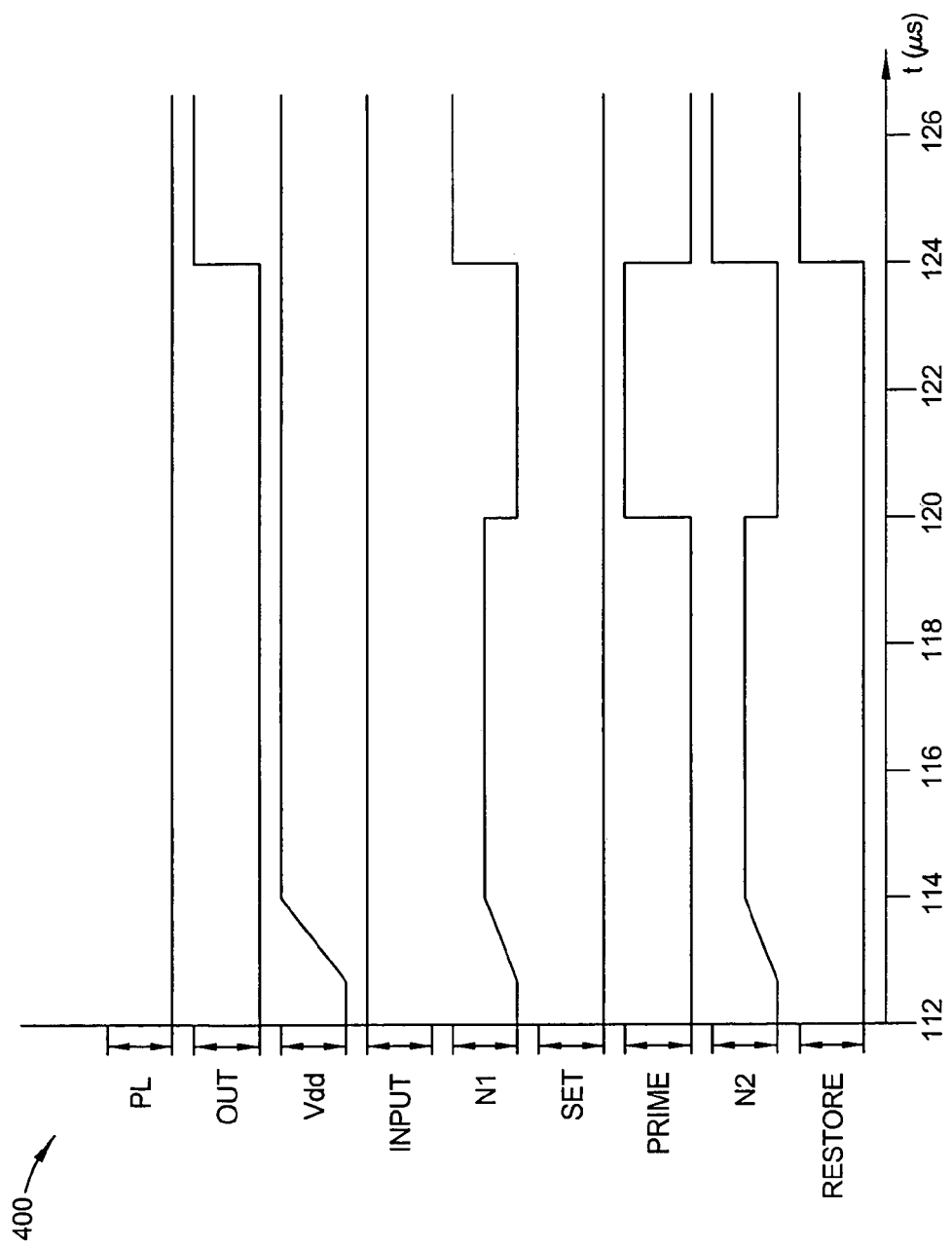
FIG. 5 is a waveform diagram further illustrating a read operation in the ferroelectric latch of FIGS. 2A and 2B.

FIG. 5 is a waveform diagram 500 further illustrating a read operation in the ferroelectric latch of FIGS. 2A and 2B, in which the previously stored (e.g., non-volatile) data state is restored from the ferroelectric capacitors $C_{FE}1$ and $C_{FE}2$ to the output OUT. Starting with the supply voltage Vdd initially low, after the supply voltage Vdd rises, the control circuit 120 retains the SET, PRIME, RESTORE, and PL signals initially low. To retrieve the non-volatile data, the PRIME signal is optionally brought high, thereby pulling the previously floating internal nodes N1 and N2 to ground. The control circuit 120 then returns PRIME to ground and raises RESTORE to Vdd. As discussed above, RESTORE may go high before or after PRIME is lowered, or the PRIME and RESTORE signals may be switched concurrently. When RESTORE goes high, charging transistors M15 and M16 begin pulling the internal nodes N1 and N2 up to Vdd, wherein the output circuit 140 will provide the device output OUT according to which internal node rises the fastest.

Figure 6:
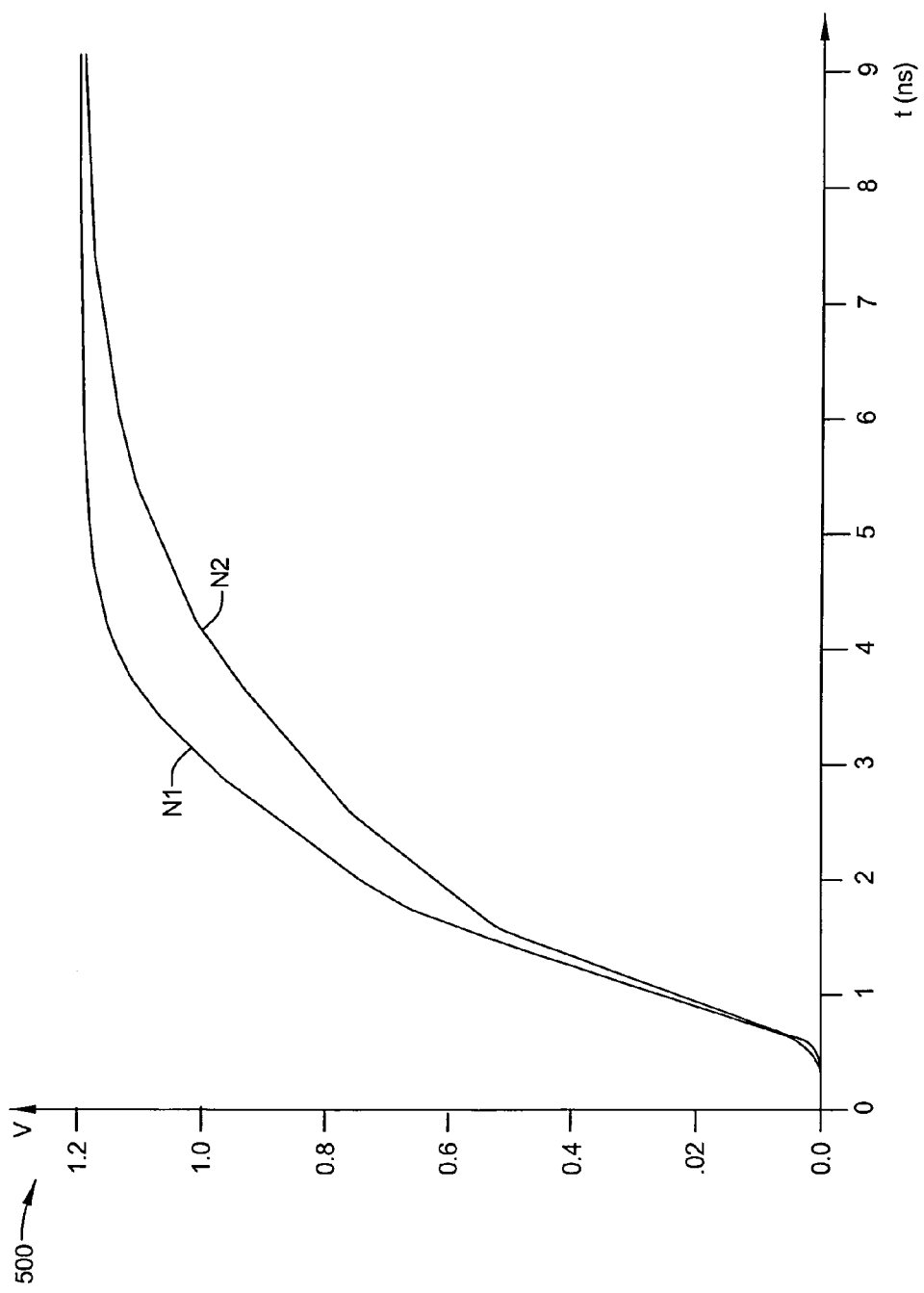
FIG. 6 is a waveform diagram illustrating rising ferroelectric capacitor node voltages during a read operation in the ferroelectric latch of FIGS. 2A and 2B.

Referring also to FIG. 6, another waveform diagram 500 illustrates the internal node voltages at N1 and N2 for the above-described case where the non-volatile data stored in the ferroelectric capacitors $C_{FE}1$ and $C_{FE}2$ corresponds to a high input voltage. As shown in FIG. 6, in this case, the capacitor $C_{FE}1$ will charge up faster than $C_{FE}2$, and accordingly, the node voltage N1 rises faster than does N2, causing the output circuit 140 to provide a high state final output OUT. It is noted in FIGS. 2A, 2B, and 6, that the drive current capability of the charging transistors can be adjusted to control the rise times of the internal nodes N1 and N2 during the RESTORE signal, and further that the switching thresholds of the NAND gates 144 and 146 can be adjusted through sizing of the various transistors M19–M26 to advantageously optimize the restore operation of the device 102 such that the node voltage separation is maximized when the higher of the node voltages reaches the flip-flop input signal switching threshold.

Figure 7A:
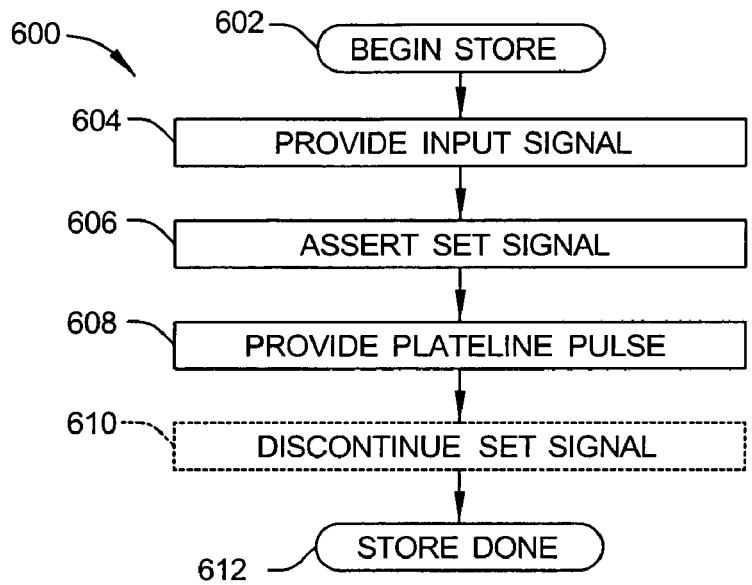
FIGS. 7A and 7B are flow diagrams illustrating a method of providing non-volatile data storage in the ferroelectric latch of FIGS. 2A and 2B in accordance with the invention.
Figure 7B:
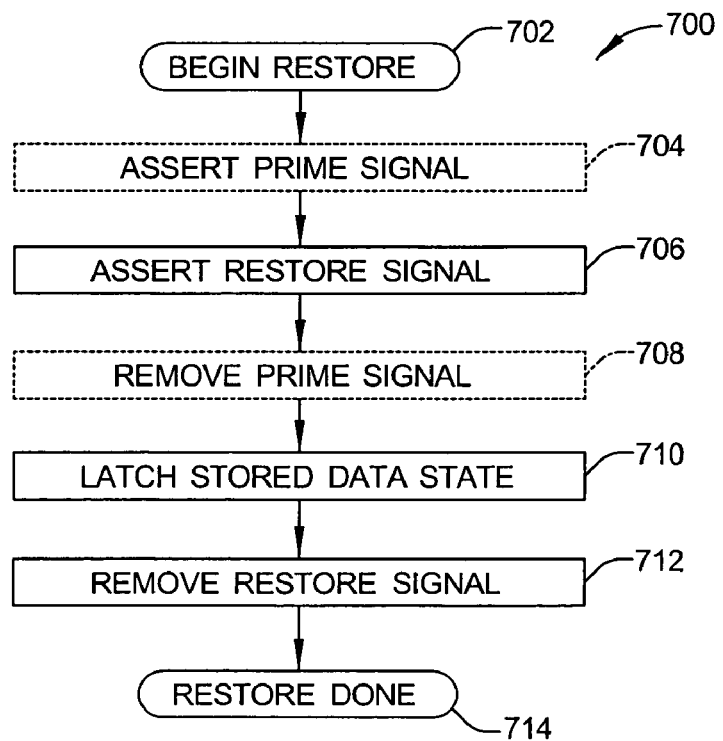

Referring now to FIGS. 7A and 7B, another aspect of the invention relates to methods for providing non-volatile data storage in a memory device, wherein a method 600 in FIG. 7A provides for initially storing or setting the device data state, and a method 700 of FIG. 7B provides for retrieving the non-volatile data state. While the exemplary methods 600 and 700 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices illustrated and described herein, as well as in association with other devices and structures not illustrated.

The methods of the invention involve the provision of voltages at first and second circuit nodes (e.g., driving the internal nodes N1 and N2 to first and second voltages in the first operational mode according to the input voltage in the device 102 above), and polarizing first and second ferroelectric capacitors (e.g., $C_{FE}1$ and $C_{FE}2$) according to the first and second circuit node voltages, respectively. In FIG. 7A, the method 600 begins at 602 with an input signal being provided at 604 (e.g., high input voltage at the INPUT node in the illustrated example above). At 606, the SET signal is asserted, which causes the input circuit 110 to provide first and second voltages at the circuit nodes N1 and N2, respectively, according to the input voltage signal. At 608, a plateline pulse signal is provided, such as the PL pulse signal of FIGS. 3 and 4, by which the first and second ferroelectric capacitors are polarized according to the first and second internal node voltages N1 and N2, respectively, in the device 102. The SET signal may then be optionally discontinued at 610, and the set or storage operation is completed at 612.

The methods of the invention further provide for allowing the circuit nodes to float, coupling the first and second circuit nodes with a first supply voltage, and latching a data state according to the first and second circuit node voltages to retrieve the non-volatile data. In FIG. 7B, the restore method or operation 700 begins at 702, wherein a PRIME signal is optionally asserted at 704 to couple the circuit nodes N1 and N2 to ground or Vss, and thereafter, a RESTORE signal is asserted at 706, thereby coupling N1 and N2 with Vdd. In the illustrated device 102 above, this causes the internal node voltages N1 and N2 rise at different rates as seen in FIG. 6, depending on the data state being restored. At 708, the optional PRIME signal is discontinued (e.g., brought low again), wherein the assertion of the RESTORE signal at 706 and the discontinuance of the PRIME signal at 708 may be in any order or may be concurrent. At 710, the data state is latched, and the RESTORE signal is removed (e.g., brought low in the above device 102), and the restore operation or method 700 ends at 714. In the illustrated device 102, the data is latched at 710 by the flip-flop circuit 142 ascertaining which internal node N1 or N2 rises fastest, and setting the output OUT accordingly.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
   an input circuit comprising:
      an input node receiving an input voltage representative of a data state,
      a first internal node, and
      a second internal node, the input circuit being operable to selectively provide the data state as first and second voltages on the first and second internal nodes, respectively, according to the input voltage in a first mode, and to allow the first and second internal nodes to float in a second mode;
   a first ferroelectric capacitor coupled between the first internal node and a plateline node;
   a second ferroelectric capacitor coupled between the second internal node and the plateline node;
   a control circuit coupled with the plateline node, the control circuit being operable to selectively provide a plateline signal to the plateline node to store the data state to the first and second ferroelectric capacitors according to the first and second voltages when the input circuit is in the first mode;
   a restore circuit coupled with the first and second internal nodes, the restore circuit being operable to restore the data state from the first and second ferroelectric capacitors to the first and second internal nodes when the input circuit is in the second mode; and
   an output circuit coupled with the first and second internal nodes, the output circuit being operable to provide a restored data state as an output according to the data state from the first and second ferroelectric capacitors when the input circuit is in the second mode.

2. The memory device of claim 1, wherein the input circuit comprises:
   a first inverter with a first inverter input, a first inverter output coupled with the first internal node, and a first inverter enable input;
   a second inverter with a second inverter input coupled with the input node, a second inverter output coupled with the second internal node, and a second inverter enable input; and
   a third inverter with a third inverter input coupled with the input node, and a third inverter output coupled with the first inverter input;
   wherein the first and second inverters are tri-state inverters operable to selectively provide the data state as first and second voltages on the first and second internal nodes, respectively, according to the input voltage in a first mode when the inverter enable inputs are in a first state, and to allow the first and second internal nodes to float in a second mode when the inverter enable inputs are in a second state.

3. The memory device of claim 2, wherein the control circuit is coupled with the first and second inverter enable inputs, and wherein the control circuit selectively provides the first and second inverter enable inputs in the first state in the first mode and in the second state in the second mode.

4. The memory device of claim 1, wherein the restore circuit comprises:
   a first charging transistor coupled with a first supply voltage and the first internal node, the first charging transistor being operable in the second mode to couple the first internal node with the first supply voltage to charge the first ferroelectric capacitor to the first supply voltage level according to a restore control signal; and
   a second charging transistor coupled with the first supply voltage and the second internal node, the second charging transistor being operable in the second mode to couple the second internal node with the first supply voltage to charge the second ferroelectric capacitor to the first supply voltage level according to the restore control signal.

5. The memory device of claim 4, wherein the control circuit is coupled with the first and second charging transistors, and wherein the control circuit selectively provides the restore control signal in the second mode.

6. The memory device of claim 5, wherein the restore circuit further comprises:
   a first discharge transistor coupled with a second supply voltage and the first internal node, the first discharge transistor being operable in the second mode to couple the first internal node with the second supply voltage according to a prime control signal; and
   a second discharge transistor coupled with the second supply voltage and the second internal node, the second discharge transistor being operable in the second mode to couple the second internal node with the second supply voltage according to the prime control signal.

7. The memory device of claim 6, wherein the control circuit is coupled with the first and second discharge transistors, and wherein the control circuit selectively provides the prime control signal in the second mode.

8. The memory device of claim 4, wherein the restore circuit further comprises:
   a first discharge transistor coupled with a second supply voltage and the first internal node, the first discharge transistor being operable in the second mode to couple the first internal node with the second supply voltage according to a prime control signal; and
   a second discharge transistor coupled with the second supply voltage and the second internal node, the second discharge transistor being operable in the second mode to couple the second internal node with the second supply voltage according to the prime control signal.

9. The memory device of claim 8, wherein the control circuit is coupled with the first and second charging transistors and with the first and second discharge transistors, and wherein the control circuit selectively provides the restore and prime control signals in the second mode.

10. The memory device of claim 8, wherein the input circuit comprises:
    a first inverter with a first inverter input, a first inverter output coupled with the first internal node, and a first inverter enable input;
    a second inverter with a second inverter input coupled with the input node, a second inverter output coupled with the second internal node, and a second inverter enable input; and a third inverter with a third inverter input coupled with the input node, and a third inverter output coupled with the first inverter input;

wherein the first and second inverters are tri-state inverters operable to selectively provide the data state as first and second voltages on the first and second internal nodes, respectively, according to the input voltage in a first mode when the inverter enable inputs are in a first state, and to allow the first and second internal nodes to float in a second mode when the inverter enable inputs are in a second state.

11. The memory device of claim 10, wherein the control circuit is coupled with the first and second inverter enable inputs, and wherein the control circuit selectively provides the first and second inverter enable inputs in the first state in the first mode and in the second state in the second mode.

12. The memory device of claim 10, wherein the output circuit comprises a flip-flop having a first flip-flop input coupled with the first internal node, a second flip-flop input coupled with the second internal node, and a flip-flop output that provides the restored data state as an output according to the first and second flip-flop inputs in the second mode.

13. The memory device of claim 8, wherein the output circuit comprises a flip-flop having a first flip-flop input coupled with the first internal node, a second flip-flop input coupled with the second internal node, and a flip-flop output that provides the restored data state as an output according to the first and second flip-flop inputs in the second mode.

14. The memory device of claim 4, wherein the input circuit comprises:

a first inverter with a first inverter input, a first inverter output coupled with the first internal node, and a first inverter enable input;

a second inverter with a second inverter input coupled with the input node, a second inverter output coupled with the second internal node, and a second inverter enable input; and a third inverter with a third inverter input coupled with the input node, and a third inverter output coupled with the first inverter input;

wherein the first and second inverters are tri-state inverters operable to selectively provide the data state as first and second voltages on the first and second internal nodes, respectively, according to the input voltage in a first mode when the inverter enable inputs are in a first state, and to allow the first and second internal nodes to float in a second mode when the inverter enable inputs are in a second state.

15. The memory device of claim 14, wherein the control circuit is coupled with the first and second inverter enable inputs, and wherein the control circuit selectively provides the first and second inverter enable inputs in the first state in the first mode and in the second state in the second mode.

16. The memory device of claim 14, wherein the output circuit comprises a flip-flop having a first flip-flop input coupled with the first internal node, a second flip-flop input coupled with the second internal node, and a flip-flop output that provides the restored data state as an output according to the first and second flip-flop inputs in the second mode.

17. The memory device of claim 4, wherein the output circuit comprises a flip-flop having a first flip-flop input coupled with the first internal node, a second flip-flop input coupled with the second internal node, and a flip-flop output that provides the restored data state as an output according to the first and second flip-flop inputs in the second mode.

18. The memory device of claim 1, wherein the restore circuit comprises a current mirror operable in the second mode to provide first and second generally equal currents to the first and second internal nodes, respectively, to charge the first and second ferroelectric capacitors according to a restore control signal.

19. The memory device of claim 1, wherein the output circuit comprises a flip-flop having a first flip-flop input coupled with the first internal node, a second flip-flop input coupled with the second internal node, and a flip-flop output that provides the restored data state as an output according to the first and second flip-flop inputs in the second mode.

20. A method of providing non-volatile data storage in a memory device, the method comprising:

providing an input voltage signal representative of a data state;

providing first and second voltages at first and second circuit nodes, respectively, according to the input voltage signal;

polarizing first and second ferroelectric capacitors according to the first and second voltages, respectively;

allowing the first and second circuit nodes to float after polarizing the first and second ferroelectric capacitors;

coupling the first and second circuit nodes with a first supply voltage; and latching a data state from the first and second circuit nodes according to voltages at the first and second circuit nodes while the first and second circuit nodes are coupled with the first supply voltage.

21. The method of claim 20, further comprising coupling the first and second circuit nodes to a second supply voltage before coupling the first and second circuit nodes with the first supply voltage.

22. The method of claim 20, wherein coupling the first and second circuit nodes with the first supply voltage causes the voltages at the first and second circuit nodes to rise at first and second rates, respectively, and wherein latching the data state from the first and second circuit nodes comprises setting an output according to which of the first and second circuit nodes rises faster.

* * * * *